(12) United States Patent
Fallside et al.

(10) Patent No.: US 6,326,806 B1
(45) Date of Patent: Dec. 4, 2001

(54) FPGA-BASED COMMUNICATIONS ACCESS POINT AND SYSTEM FOR RECONFIGURATION

(75) Inventors: Hamish T. Fallside, Los Gatos; Michael J. S. Smith, Palo Alto, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/539,163

(22) Filed: Mar. 29, 2000

(51) Int. Cl.[7] .............................. G06F 7/38; H03K 19/173
(52) U.S. Cl. ................................. 326/38; 326/47
(58) Field of Search ................................. 326/47, 38, 41, 326/40, 46

(56) References Cited

U.S. PATENT DOCUMENTS

| Re. 34,363 | * | 8/1993 | Freeman ................................. 326/38 |
| 5,684,980 | | 11/1997 | Casselman ............................ 395/500 |
| 5,802,290 | | 9/1998 | Casselman ............................ 395/200 |
| 5,838,167 | * | 11/1998 | Erickson et al. ....................... 326/38 |
| 6,094,063 | * | 7/2000 | St. Pierre, Jr. et al. ............... 326/37 |

FOREIGN PATENT DOCUMENTS

WO 99/23588   5/1999  (WO) .

OTHER PUBLICATIONS

Xilinx Application Note by Carl Carmichael, "Configuring Virtex FPGAs from Parallel EPROMs with a CPLD", XAPP 137 (Version 1.0) Mar. 1, 1999, pp. 1–7.

* cited by examiner

Primary Examiner—Michael Tokar
Assistant Examiner—Daniel D. Chang
(74) Attorney, Agent, or Firm—LeRoy D. Maunu (57) ABSTRACT

An FPGA-based communications access point and system for reconfiguration of the FPGA via a communications channel are described in various embodiments. One embodiment includes a physical interface circuit, a storage element (e.g., a RAM), an FPGA, and a configuration control circuit. The physical interface circuit is arranged for connection to a communications channel and is coupled to the FPGA. The configuration control circuit includes a controlling circuit (e.g., a PLD) and a memory circuit (e.g., a PROM). The PROM is configured with an initial configuration bitstream for the FPGA. The initial configuration bitstream implements both a communications protocol and a control function that writes configuration bits received by the FPGA via the communications channel to the RAM. The control function also generates a reconfiguration signal responsive to a first predetermined condition. The PLD is configured to load the initial configuration bitstream from the PROM into the FPGA, and, responsive to the reconfiguration signal from the FPGA, to load a second configuration bitstream from the RAM into the FPGA. The control function may be configured to interact with standard network programs such as FTP (file transfer protocol) or custom programs.

40 Claims, 5 Drawing Sheets

FPGA-BASED COMMUNICATIONS ACCESS POINT AND SYSTEM FOR RECONFIGURATION

FIELD OF THE INVENTION

The present invention generally relates to the configuration of field programmable gate arrays (FPGAs), and more particularly to an FPGA configured as a communications access point and reconfiguration of an FPGA via a communications channel.

BACKGROUND

Increasing numbers of Internet appliances ("appliances") are appearing and supplanting some of the Internet accessibility functions that have traditionally been provided by personal computers/workstations (PCs). For example, individual appliances that provide email, music downloads, radio, and web browsing as well as other functions are presently available.

While such appliances typically do not exhibit the full range of hardware and software found on most PCs, they are often implemented in accordance with the same general architecture: a processor, a memory, an operating system, and an application program. The processor is generally highly optimized for arithmetic and data processing and includes an instruction processing pipeline and floating-point unit. However, many of the performance-enhancing features of the processor are unused during communication. The operating system is sometimes an adaptation of a general purpose operating system for a PC, with the appliance operating system not being fully optimized for network communications. Thus, the appliances may be relatively inexpensive to engineer, but inefficient in terms of resource utilization and performance.

Field programmable gate arrays (FPGAs) are frequently used in communications, data processing, data storage and other applications. The appealing characteristics of FPGAs are speed that approaches that of an application specific integrated circuit (ASIC) and programmability for design flexibility. As compared to a stored program processor arrangement, however, the re-programmability of an FPGA is less convenient. For example, to upgrade a program in a stored program processor arrangement, the operating system can be used to replace a program file. Thus, in the context of an Internet appliance, a program may be upgraded over the Internet. An FPGA, in contrast, generally requires special hardware to provide a configuration bitstream to the FPGA. Thus, while the speed of FPGAs provides an advantage for use in Internet appliances, the traditional methods for reconfiguring FPGAs have disadvantages.

A system and method that address the aforementioned problems, as well as other related problems, are therefore desirable.

SUMMARY OF THE INVENTION

An FPGA-based communications access point and system for reconfiguration of the FPGA via a communications channel are described in various embodiments. One embodiment of the invention includes a physical interface circuit (PHY), a storage element, an FPGA, and a configuration control circuit. The storage element can be, for example, a RAM, FIFO, disk drive, or flash memory. The physical interface circuit is arranged for connection to a communications channel and is coupled to the FPGA. (The communications channel may be a wired or wireless network, for example, a local area network, a wide area network, or the Internet.) The configuration control circuit includes a controlling circuit (e.g., a programmable logic device, or PLD) and a memory device (e.g., a PROM). The memory device is loaded with an initial configuration bitstream for the FPGA. The initial configuration bitstream implements both a communications protocol and a control function that writes configuration bits received by the FPGA via the communications channel to the storage element. (In some embodiments, other user functions or applications are also included in the initial configuration bitstream.) The control function also generates a reconfiguration signal responsive to a first predetermined condition. The controlling circuit is configured to load the initial configuration bitstream from the memory device into the FPGA (e.g., to "bootstrap" the FPGA, or configure the FPGA on powerup), and, responsive to the reconfiguration signal from the FPGA, to load a second configuration bitstream from the storage element into the FPGA. In another embodiment, the controlling circuit loads a third configuration bitstream from the memory device, and so forth. When the FPGA is partially reconfigurable, after the initial configuration step the reconfigurations from the memory device or the storage element may be full or partial reconfigurations, i.e., may provide configuration bitstreams to reconfigure all or part of the FPGA.

In one embodiment, the initial configuration bitstream is stored on a PROM or other memory device that is local relative to the board on which the FPGA is mounted. In another embodiment, the initial configuration bitstream is provided from an off-board source.

In another embodiment, where the FPGA is partially reconfigurable, the controlling circuit is implemented in the FPGA itself by the initial configuration bitstream. Thus, in this embodiment, the initial configuration bitstream implements: 1) a communications protocol; 2) a control node for passing new configuration data (received via the communications channel) from the FPGA to the storage element and for generating a reconfiguration signal; and 3) a controlling circuit responsive to the reconfiguration signal that uses the new configuration data stored in the storage element to partially reconfigure the FPGA. Optionally, a user application is also implemented by the initial configuration bitstream. In other embodiments, one or more user applications are supplied in the new configuration data via the communications channel. These self-reconfiguring embodiments require an additional bootstrapping circuit for initial configuration of the FPGA. For example, the bootstrapping circuit may include a PROM controlled by the FPGA using the well-known "master-slave" circuit structure and utilizing hard-wired circuits provided in the FPGA. These self-reconfiguring embodiments can be implemented, for example, in the Virtexm family of FPGAs available from Xilinx, Inc.

In another embodiment including self-reconfiguration of a partially reconfigurable FPGA, the storage element is implemented in the FPGA itself (for example, in block RAM resources of the FPGA) by the initial configuration bitstream. In this embodiment, reconfigurations from the storage element are always partial reconfigurations not affecting the FPGA resources used to implement the storage element. In one embodiment, both the storage element and the controlling circuit are implemented in the FPGA.

Thus, the invention provides systems and methods by which an FPGA can be reconfigured via a communications channel using standard communications protocols, and without the intervention of a processor or network server at the FPGA site.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings, in which.

DETAILED DESCRIPTION

In accordance with various embodiments of the invention, a configuration bitstream that implements a protocol consistent with a selected communications channel is used to configure an FPGA. For example, in one embodiment a TCP/IP stack is implemented in the FPGA by the configuration bitstream. Depending on the particular application to be implemented (i.e., the function to be performed by the FPGA), both the communications protocol and the application may be implemented on the FPGA. Alternatively, the application may be implemented in another FPGA, or in a plurality of FPGAs. A configuration control circuit is coupled to the FPGA(s) to initially configure the FPGA(s) and to assist in reconfiguration of the FPGA(s) via the communications channel.

Figure 1:
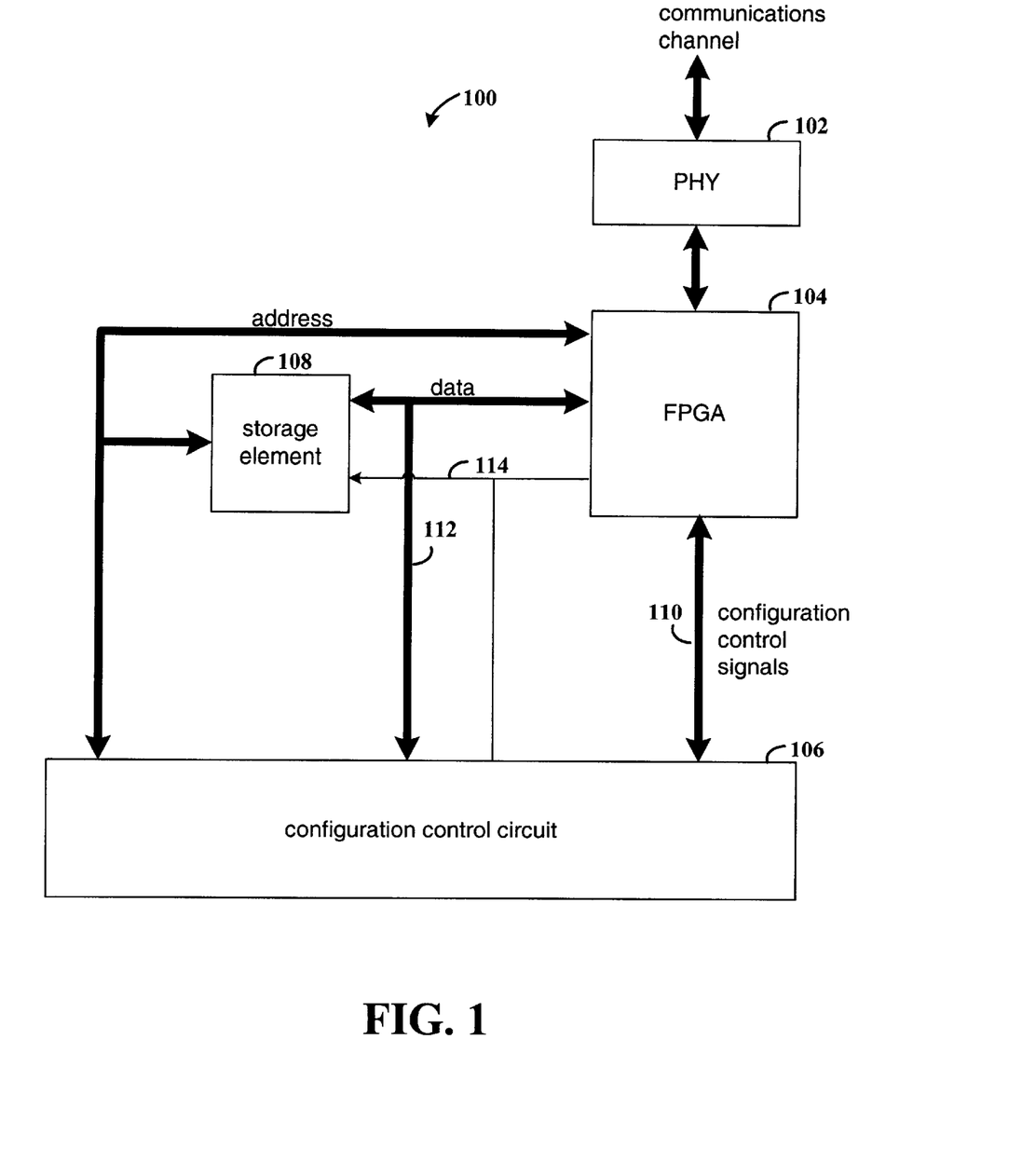
FIG. 1 is a block diagram of an FPGA-based communications access point in accordance with one embodiment of the invention.

FIG. 1 is a block diagram of a FPGA-based communications access point in accordance with one embodiment of the invention. The FPGA-based communications access point (or "node") provides a communications interface via an FPGA and also supports reconfiguration of the FPGA without direct connection to a computer or processor. Node 100 includes physical interface circuit (PHY) 102, FPGA 104, configuration control circuit 106, and storage element 108. Configuration control circuit 106 is coupled to FPGA 104 via line 110, on which control signals are exchanged.

An initial configuration bitstream for FPGA 104 is provided on data bus 112 to FPGA 104 and can be obtained from a variety of sources. For example, the initial configuration bitstream may be stored in a PROM (not shown) that is on the same circuit board as the FPGA, in which case the PROM may be connected to data bus 112. In another embodiment, the initial configuration bitstream is taken from a source that is off-board relative to the FPGA. In yet another embodiment, the initial configuration bitstream is stored in a memory device incorporated into configuration control circuit 106.

The initial configuration bitstream is loaded when node 100 is powered-up. Configuration control circuit 106 is configured to automatically provide the initial configuration bitstream to FPGA 104 at power-up. After power-up, FPGA 104 controls the configuration control circuit for the initiation of subsequent reconfigurations from any of several sources.

The initial configuration bitstream implements on FPGA 104 a communications protocol such as a TCP/IP stack. This feature allows FPGA 104 to interface with a communications channel such as a network via PHY circuit 102. Those skilled in the art will recognize other alternative communications protocols that can be implemented on the FPGA. For example, the communications channel may be based on radio wave signals, wherein the PHY circuit is a radio transceiver. Protocols such as those based on Bluetooth technology may be implemented on the FPGA for wireless communications applications. Depending on the nature of the application implemented by node 100, additional functionality may also be implemented on the FPGA with the initial configuration bitstream.

Node 100 also supports the reconfiguration of FPGA 104 via the communications channel. The reconfiguration of FPGA 104 begins with downloading a full or partial configuration bitstream to node 100 via the communications channel. The configuration bitstream is received by FPGA 104 via the implemented communications protocol and stored in storage element 108. Thus, to support reconfiguration, the initial configuration bitstream must implement on FPGA 104 the functionality to save a new configuration bitstream from the communications channel to storage element 108 and signal configuration control circuit 106 when the FPGA is to be reconfigured.

In this embodiment, the FPGA is also configured to initiate reconfiguration by the configuration control circuit in response to predetermined conditions. For example, the FPGA may be responsive to an externally provided signal to initiate reconfiguration. Alternatively, the FPGA may be configured to automatically initiate reconfiguration whenever a new bitstream is received and stored in the storage element, or whenever one or more signals internal to the FPGA reach a predefined state.

Both FPGA 104 and configuration control circuit 106 are coupled to storage element 108 via line 114 in order to provide control signals. FPGA 104 controls storage element 108 for writing data, and configuration control circuit 106 controls the storage element for reading data.

Conventional components can be used to implement node 100. For example, in one embodiment PHY circuit 102 includes an Ethernet transceiver along with a pulse transformer to isolate the transceiver from the network cable. A Virtex™ FPGA from Xilinx is used for FGPA 104, and a CPLD from Xilinx is used to implement configuration control circuit 106. Storage element 108 can be implemented as two banks of asynchronous one-byte wide SRAM. Alternatively, if the FPGA has sufficient configurable block RAM resources and sufficient configurable logic resources, both the storage element and the communications protocol can be implemented on a single FPGA (which excludes full reconfiguration of the FPGA). Conventional address and data buses are used to connect the FGPA, configuration control circuit, and storage element.

In other embodiments, the function of configuration control circuit 106 is implemented in a microcontroller, another FPGA, or even on FPGA 104. However, it will be appreciated that if FPGA 104 also implements functions of configuration control circuit 106, then additional external circuitry is required to initiate an initial configuration and subsequent total reconfigurations of the FPGA. Alternatively, after the initial configuration, subsequent reconfigurations of FPGA 104 may be limited to partial reconfigurations.

It will be appreciated that the characteristics of PHY circuit 102 are dictated in accordance with the particular communications channel over which the FPGA communicates. For example, in other embodiments PHY circuit 102 is a conventional radio transceiver or a conventional transceiver suited for a network other than Ethernet. It will also be appreciated that the communications protocol functions implemented on the FPGA are those that are compatible with the selected communications channel, for example, Bluetooth or Myranet channels.

Figure 2:
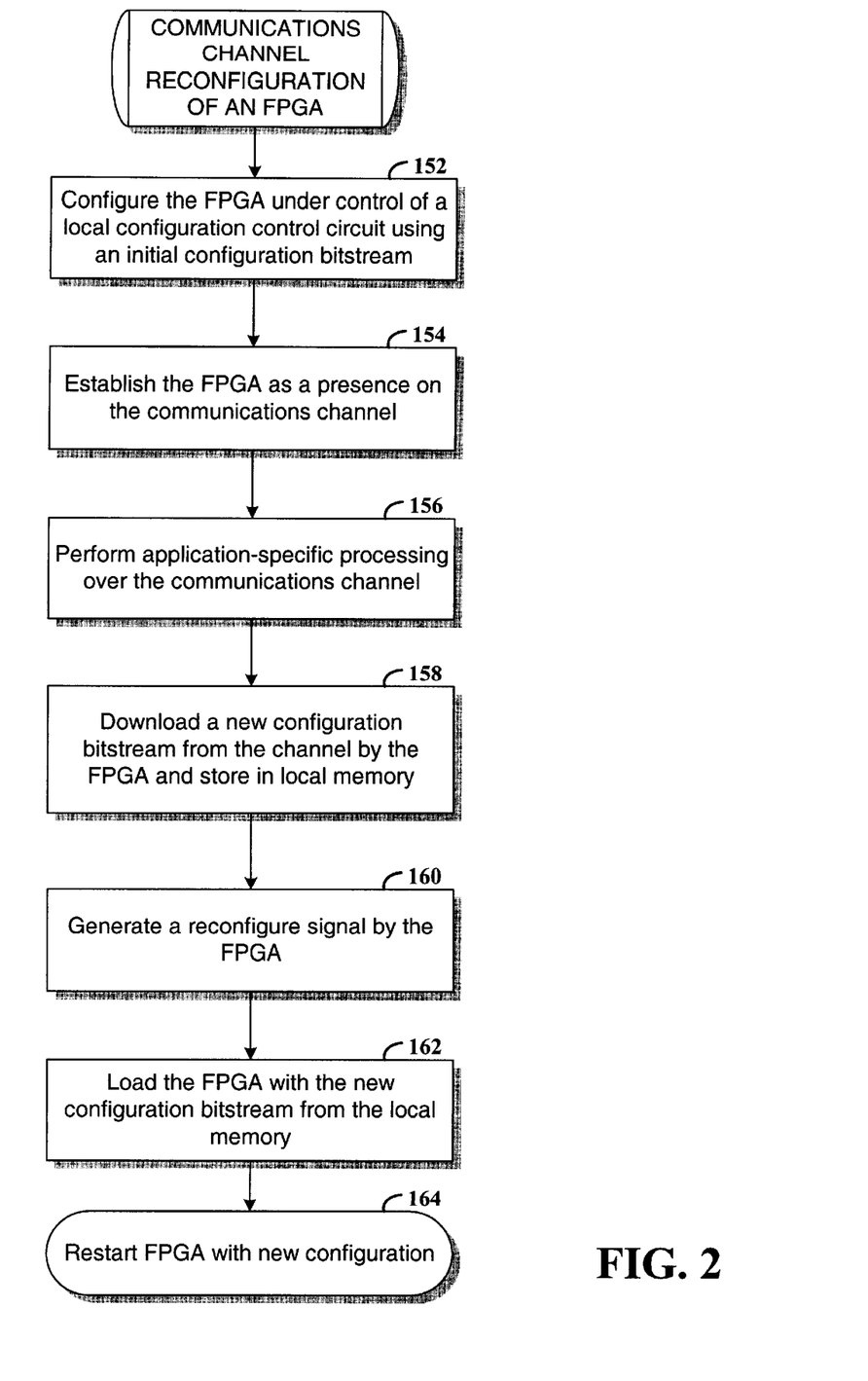
FIG. 2 is a flow chart of an example process for communications-channel reconfiguration of an FPGA in accordance with one embodiment of the invention.

FIG. 2 is a flow chart of an example process for communications-channel reconfiguration of an FPGA in accordance with one embodiment of the invention. The process begins at step 152, where the FPGA is configured under control of a local configuration control circuit. For example, the configuration control circuit may be resident on the same circuit board as the FPGA. The initial configuration of the FPGA is performed when the system is powered-on.

The initial configuration bitstream implements logic on the FPGA that implements a communications protocol. Logic cores that implement communications protocols are commercially available for ASICs and are adaptable for use with FPGAs. Alternatively, a custom logic core developed in accordance with the applicable protocol can be used. The initial configuration bitstream also implements functionality for receiving a full or partial configuration bitstream over a communications channel and storing the bitstream in a local storage element.

At step 154, the FPGA is established as a node on the communications channel (after performing any start-up functions as implemented by the initial configuration bitstream). The logic required for this operation is implemented in the communications protocol of the initial configuration bitstream. Once the FPGA has established a communications channel presence, the application-specific functions of the node can be performed (step 156). For example, the application may be a small web server. It will be appreciated that any application may require additional hardware resources, such as RAM and additional FPGAs.

At step 158, a new configuration bitstream is received over the communications channel by the FPGA. In response, the FPGA stores the new configuration bitstream in a local memory (e.g., in a local RAM) in accordance with the functions implemented on the FPGA by the initial configuration bitstream. After the new configuration bitstream has been received and stored, the FPGA generates a signal to the local configuration control circuit (step 160) indicating that the FPGA is to be reconfigured.

At step 162, in response to the signal from the FPGA, the configuration control circuit places the FPGA in an operating mode that supports reconfiguration and loads the FPGA with the new configuration bitstream from the local memory. For example, if the FPGA is a Virtex FPGA, then the configuration may be performed in either a bit-serial mode or a SelectMAP mode that uses an 8-bit configuration bus, which decreases configuration time compared to a bit-serial configuration. Once the FPGA has been reconfigured, the configuration control circuit signals the logic implemented on the FPGA to initiate a start-up sequence (step 164).

Those skilled in the art will appreciate that the processes of steps 154–156 are repeated to reestablish the node on the communications channel and perform application-specific functions. If further reconfiguration is required, the sequence of steps 158–164 can be repeated as necessary. Where the FPGA has been partially reconfigured, the FPGA need not be restarted as shown at step 164. Rather, the FPGA continues operating during the partial reconfiguration.

Figure 3:
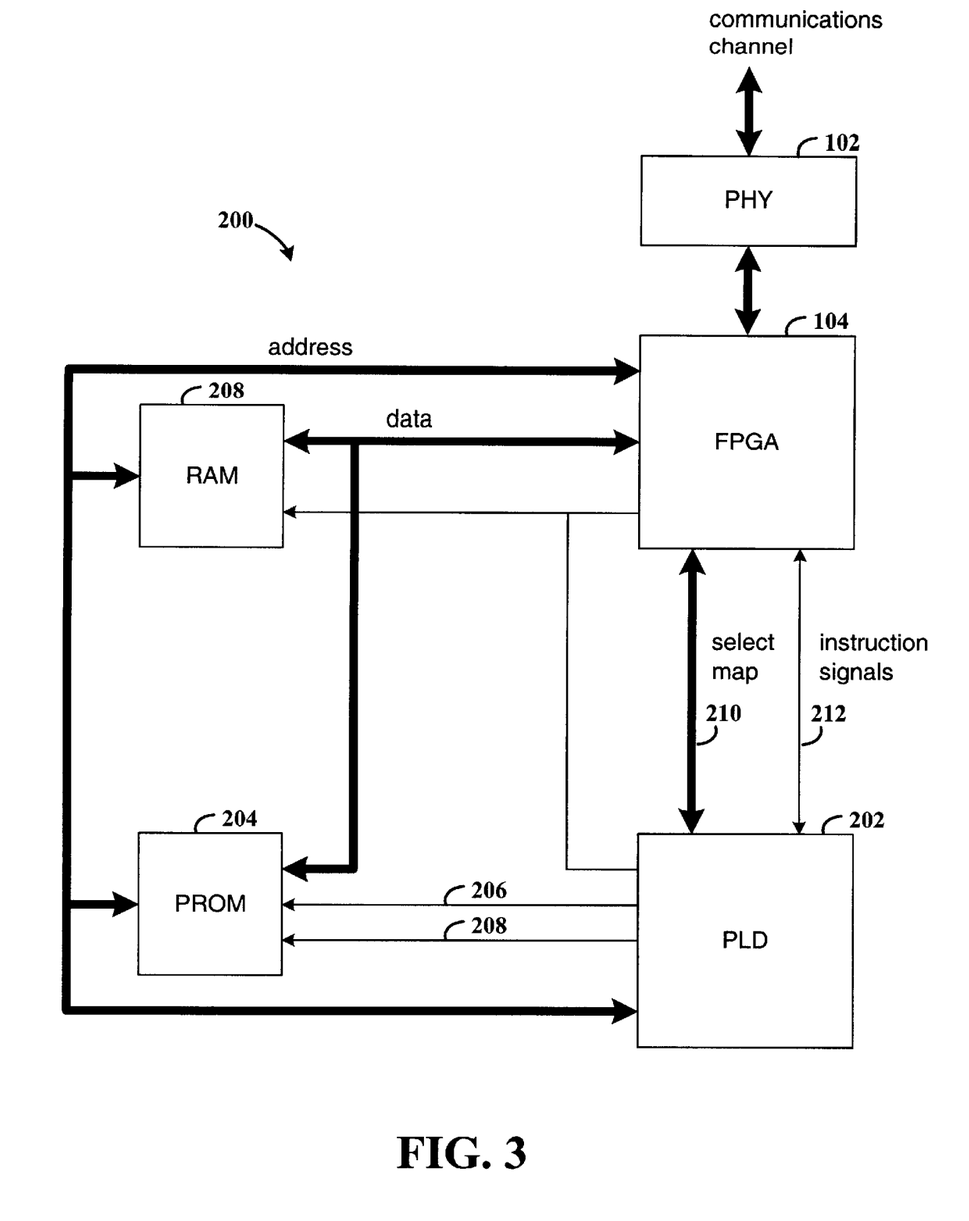
FIG. 3 is a block diagram of an FPGA-based communications access point that supports communications-channel reconfiguration of the FPGA.

FIG. 3 is a block diagram of an FPGA-based communications channel node that supports communications-channel reconfiguration of the FPGA in accordance with a specific embodiment of the invention. Node 200 includes, in addition to PHY circuit 102 and FPGA 104, RAM 208, PLD 202, and PROM 204. Note that the storage element (108 in FIG. 1) is implemented as RAM 208 in this embodiment, while the configuration control circuit (106 in FIG. 1) is implemented using PLD 202 and PROM 204. PLD 202 implements the controlling circuit functions for the initial configuration of FPGA 104 and any subsequent reconfiguration. Devices such as the XC9500 series CPLDs from Xilinx are suitable for implementing PLD 202. The initial configuration bitstream is stored in PROM 204, which is coupled to both the address and data buses. Lines 206 and 208 carry control signals from PLD 202 to PROM 204. The control signals include, for example, chip-select and output-enable signals.

Lines 210 and 212 carry signals used in configuring FPGA 104. The control signals described below are applicable to the Virtex FPGA from Xilinx. However, it will be appreciated that the invention can be adapted to different FPGAS, from Xilinx or other vendors, using the applicable control signals.

The select map signals on line 210 are those used in configuring the Virtex FPGA in the SelectMAP configuration mode. The SelectMAP configuraton mode utilizes an 8-bit configuration bus (the data bus) and seven control signals for synchronization and handshaking. The select map control signals and descriptions are as follows.

FPGA_CCLK is the configuration clock input signal used by the configuration logic internal to the FPGA.

FPGA_PROG is the input signal that resets the internal configuration logic and re-initializes the internal configuration memory.

FPGA_DONE is the output signal that indicates the completion of the configuration and the beginning of the start-up sequence.

FPGA_INIT is a bi-directional open-drain pin that is used to hold off configuration initialization and to indicate CRC errors in the configuration data.

FPGA_WRITE is a write strobe that must be asserted and held throughout the loading of data.

FPGA_BUSY is an open-drain output signal that indicates whether the current byte is being loaded or ignored.

FPGA_CS is the chip select signal that is used to enable the FPGA to sense input signals.

SelectMAP configuration mode is selected on the Virtex FPGA using configuration mode select signals FPGA_M2, FPGA_M1, and FPGA_M0. For example, FPGA_M2, FPGA_M1, and FPGA_M0 for SelectMAP mode are <110>. These values can be set, for example, by coupling the FPGA pins for these signals to power high, power high, and ground, respectively, e.g., by hardwiring these connections on the board on which the FPGA is mounted. Alternatively, any other configuration mode supported by the FPGA can also be used, and the signals exchanged by PLD 202 and FPGA 104 are adjusted accordingly.

Additional details for configuring a Virtex FPGA via the SelectMAP interface can be found in the Xilinx Application Note XAPP 137, entitled, "Configuring Virtex FPGAs from Parallel EPROMSs with a CPLD" by Carl Carmichael, Mar. 1, 1999, which is incorporated herein by reference.

Four of the configuration instruction signals on lines 212 are used by the FPGA to control the configuration control circuit. In the embodiment of FIG. 3, the configuration instruction signals applied by the PLD include CFG_MODE_ENABLE, CFG_MODE, CFG_TRIGGER, and CFG_LENGTH. The CFG_MODE signal is a multi-bit signal that indicates to the PLD the reconfiguration instruction to perform, i.e., the operating mode to enter. The CFG_MODE_ENABLE signal indicates to the PLD that the specified instruction is ready to be performed. The various reconfiguration instructions are described below with reference to FIG. 4. The CFG_TRIGGER signal indicates to the PLD that reconfiguration can commence. The CFG_LENGTH signal is a multi-bit signal provided to the PLD to indicate the length of a configuration bitstream for a partial reconfiguration of the FPGA. As an alternative to the CFG_LENGTH signal, the FPGA can be configured to signal the configuration control circuit on a byte-by-byte basis, which saves pin resources and simplifies the configuration control circuit at the expense of added logic implemented on the FPGA.

Lines 212 also include a CFG_BUSY signal provided by the configuration control circuit to the FPGA. The CFG_BUSY signal indicates that a reconfiguration process is in progress and cannot be interrupted.

Figure 4:
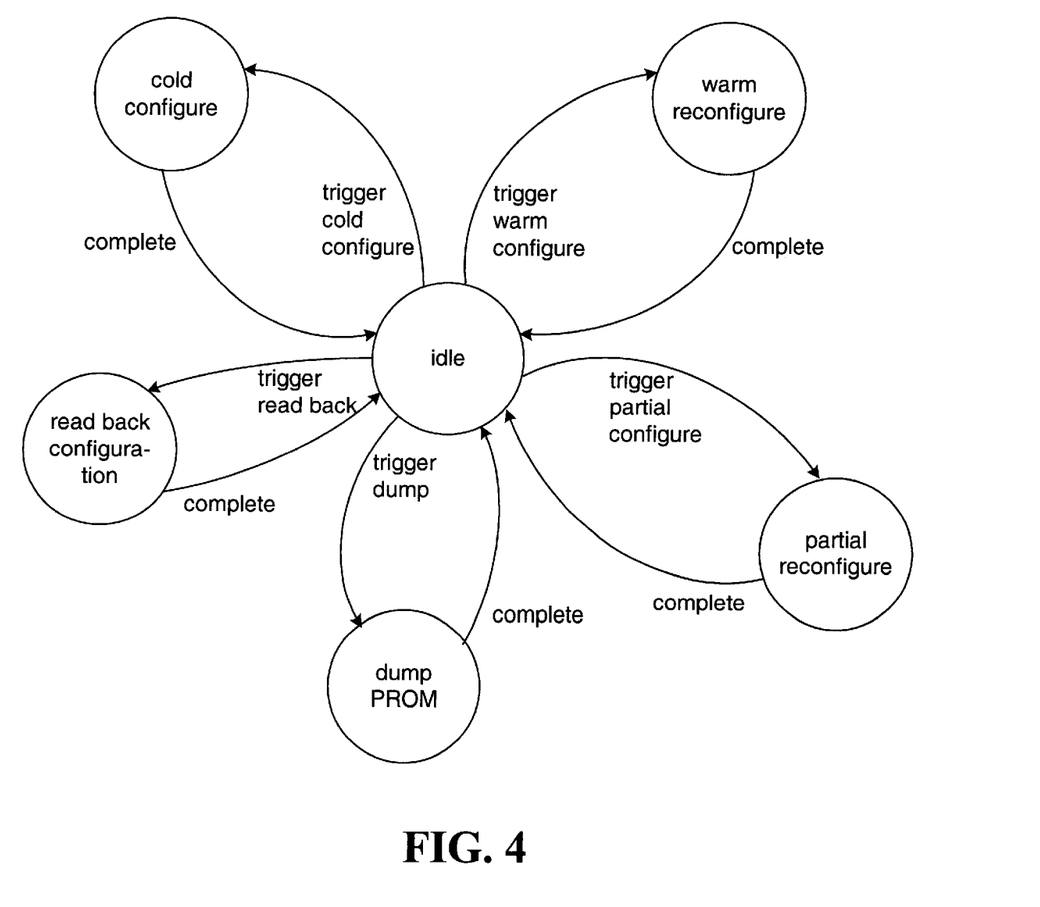
FIG. 4 is a state diagram that illustrates the various operating modes of an FPGA-based communications access point.

FIG. 4 is a state diagram that illustrates the various operating modes of the FPGA-based node (or of the configuration control circuit) relative to configuration and reconfiguration. It will be appreciated that any application-specific states are encompassed in the idle mode. It is also assumed that the FPGA has been initially configured and that the FPGA is operating as a node on the communications channel. It will be further appreciated that while the configuration operations associated with the various operating modes of this embodiment are controlled by the configuration control circuit (e.g., the PLD), the changes in operating mode are actually triggered by the FPGA using the configuration instruction signals, as described below.

In the idle mode, the PLD is inactive and awaiting the TRIGGER signal (CFG_TRIGGER) from the FPGA. If a PROM is used to store a configuration bitstream, the PROM is disabled so that it does not interfere with the data bus that is shared with the RAM. The FPGA configuration interface is also disabled in the idle mode.

There are five active operating modes supported in the example embodiment for reconfiguring the FPGA and for manipulating the configuration bitstream. The active modes include cold configure, warm reconfigure, partial reconfigure, dump PROM, and read back configuration. Each of the modes is selected and initiated by the FPGA by signaling the PLD using the configuration instruction signals on lines 212. After the FPGA triggers the PLD for the selected operating mode, the FPGA is inoperative relative to interfacing with the PLD and the RAM until the PLD returns to the idle mode.

In the cold configure mode, the PLD loads a configuration bitstream from the PROM to the configuration interface of the FPGA using the select map signals on lines 210. The cold configure mode can be used during initial power-up of the node and at a later time, depending on the operational needs of the FPGA. When configuration is complete, the PLD returns to the idle mode.

The warm reconfigure mode is used by the FPGA for reconfiguration using a bitstream received over the communications channel. As described above, when the FPGA receives such a bitstream, the bitstream is stored in the RAM. In the warm reconfigure mode, the PLD loads the configuration bitstream from the RAM to the FPGA and returns to the idle mode when configuration is complete. If an error is encountered during the configuration process, the PLD returns to the idle mode.

In the partial reconfigure mode, the FPGA is partially reconfigured using a configuration bitstream from the RAM. Before triggering the partial reconfiguration, the FPGA provides the LENGTH (via the CFG_LENGTH signal) to the PLD to indicate the number of 8-bit words to transfer from the RAM to the FPGA. In one embodiment, the configuration bitstream is read from RAM address 0 and provided as input to the FPGA via a configuration map interface that is a standard feature of the FPGA. Information that directs storage of the configuration bitstream at particular locations in the FPGA is embedded in the configuration bitstream. The PLD asserts the CFG_BUSY signal during the partial reconfiguration to prevent the FPGA from triggering another reconfiguration, and after the partial reconfiguration is complete the PLD deasserts the CFG_BUSY signal and returns to the idle mode. The partial reconfigure mode also supports cycle-by-cycle FPGA control of the reconfiguration. Upon receiving the appropriate CFG_TRIGGER signal, the PLD provides the FPGA_CS and FPGA_WRITE signals (described above with reference to FIG. 3) to the FPGA to allow the FPGA to control its configuration map interface. The FPGA reads from the RAM and asserts the interface signals for each byte until all of the partial configuration data has been written to the FPGA.

In the dump PROM or dump memory mode, which can be used for testing, the PLD transfers the configuration bitstream from the PROM to the RAM. During the transfer, the PLD asserts the CFG_BUSY signal, and when complete the CFG_BUSY signal is deasserted and the PLD returns to the idle mode. The initial configuration bitstream read from the PROM is now available in the RAM for transmission across the communications channel, or for reconfiguration of the FPGA from the RAM. These steps are useful for testing the configuration and reconfiguration circuitry of the FPGA. While the PLD is busy with the transfer, the FPGA cannot receive a configuration bitstream from the communications channel and store the bitstream in the RAM, but it may receive the bitstream and buffer the bitstream in another RAM or an on-chip RAM.

The read back configuration mode allows the PLD to read the current configuration data of the FPGA and store the configuration data in the RAM. While the configuration data is being read from the FPGA, the PLD asserts the CFG_BUSY signal. The read back mode is useful for reading back state information from the FPGA to determine whether the system is operating as expected. For example, another system on the communications channel may request the current configuration data from the FPGA. The FPGA then initiates a read back transfer, and the PLD reads the configuration data from the FPGA and stores in the RAM. The FPGA then transfers the configuration data from the RAM to the requesting destination on the communications channel.

Figure 5:
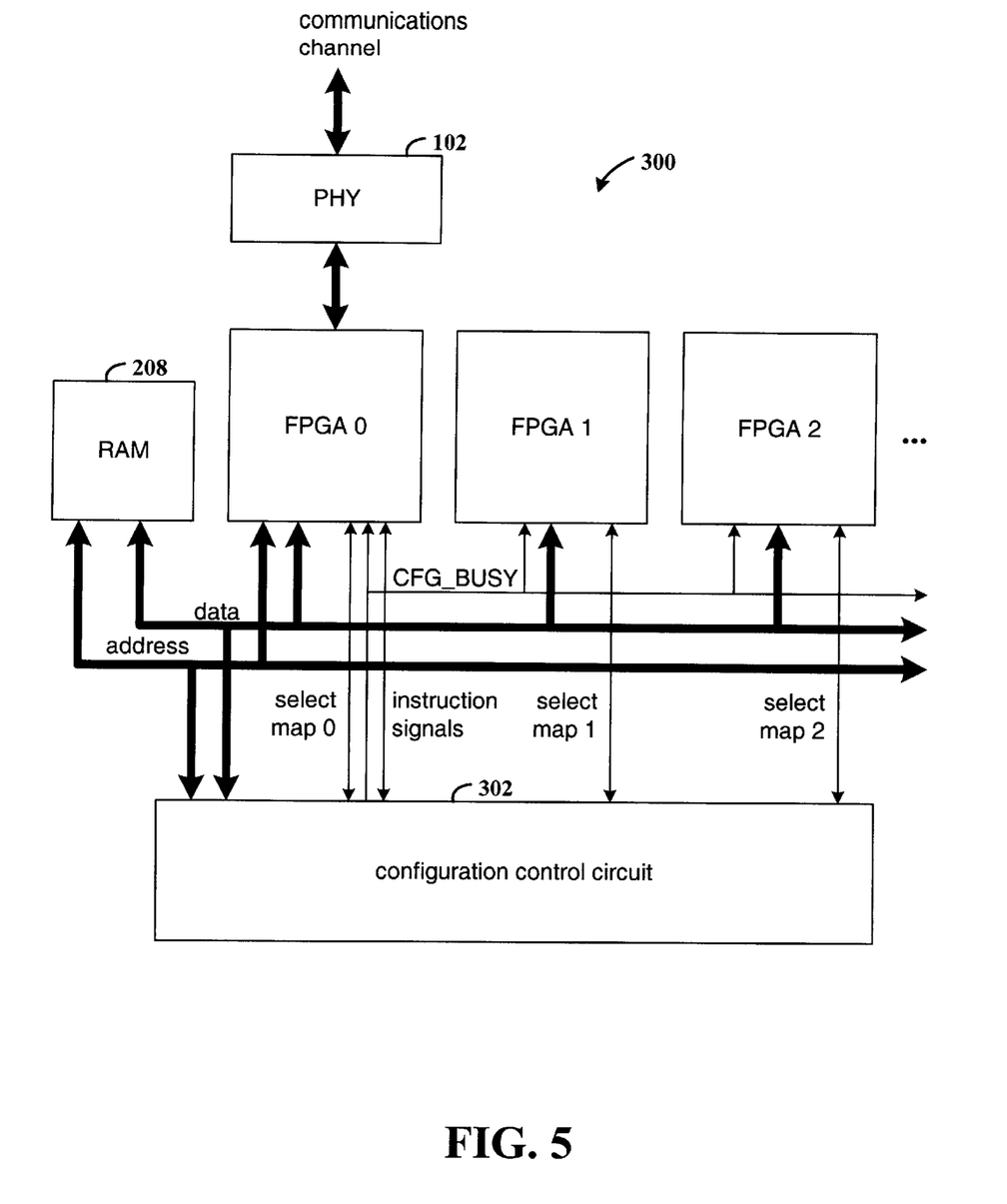
FIG. 5 is a block diagram of a system including a plurality of FPGAs that are reconfigurable via a communications channel.

FIG. 5 is a block diagram of a node including a plurality of FPGAs that are reconfigurable via a communications channel. Node 300 includes PHY circuit 102, FPGA 0, RAM 208, configuration control circuit 302, and a plurality of additional FPGAs, for example, FPGA 1 and FPGA 2. FPGA 0 is configured with a configuration bitstream that implements a communications protocol as described above, thereby providing an interface for the functionality implemented on the additional FPGAs 1, 2, . . . .

Configuration control circuit 302 is coupled to each of the individual FPGAs 0, 1, 2, . . . via respective select map signal lines and to FPGA 0 via the configuration instruction signal lines, as described above. The CFG_BUSY signal is driven by configuration control circuit 302 to each of the FPGAS. Each of the FPGAs is coupled to RAM 208 via address and data buses. It will be appreciated that there are numerous alternative reconfiguration arrangements for multiple FPGAS, for example, daisy chaining the FPGAS, or configuring each FPGA to control its own reconfiguration as in FPGA 104 of FIG. 3. However, in the embodiment of FIG. 5, FPGA 0 is in effect a master reconfiguration controller for all of the FPGAS.

An example process flow for reconfiguring an FPGA in node 300 is explained below. Under the control of logic implemented on FPGA 0, a configuration bitstream is downloaded over the communications channel and stored in RAM 208. When the download is complete, FPGA 0 signals for the logic of the target FPGA to be reconfigured. In other words, FPGA 0 provides the desired configuration instruction signals to configuration control circuit 302 and then triggers the reconfiguration. With FPGA 0 acting as a master reconfiguration controller, the configuration instruction signals must include one or more signals identifying the target FPGA. The configuration control circuit then drives the appropriate select map signals to the target FPGA and reads the configuration bitstream from RAM 208 for transfer to the configuration port of the target FPGA. After the configuration bitstream has been loaded into the target FPGA, the start-up sequence of the FPGA is performed.

In an example application, the configuration control circuit is configured for decryption of a configuration bitstream received by the FPGA over the communications channel and stored in the RAM. The application can be implemented using any of the embodiments of FIGS. 1, 3, or 5. Because a configuration bitstream may be transmitted over a public communications channel such as the Internet, it may be desirable for the configuration bitstream to be encrypted prior to transmission and decrypted at the node. The selection of the particular encryption/decryption technique employed depends upon application-specific requirements.

The present invention is believed to be applicable to a variety of systems for configuring PLDS, and has been found to be particularly applicable and beneficial in configuring FPGAs over a communications channel. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit arrangement for reconfiguration of an FPGA over a communications channel, comprising:

a physical interface circuit arranged for connection to a communications channel;

a storage element;

an FPGA coupled to the storage element and to the physical interface circuit;

a configuration control circuit coupled to the FPGA and to the storage element, the configuration control circuit being configured and arranged to load the FPGA with an initial configuration bitstream that implements both a communications protocol and a control function, wherein the control function writes configuration bits received by the FPGA from the physical interface circuit to the storage element and generates a reconfiguration signal responsive to a first predetermined condition, the configuration control circuit being further configured and arranged to load a second configuration bitstream from the storage element into the FPGA responsive to the reconfiguration signal from the FPGA.

2. The circuit arrangement of claim 1, wherein the configuration control circuit comprises:

a memory device for storing the initial configuration bitstream; and a controlling circuit configured and arranged to load the FPGA with the initial configuration bitstream from the memory device and to load the second configuration bitstream from the storage element into the FPGA.

3. The circuit arrangement of claim 2, wherein the memory device is a PROM.

4. The circuit arrangement of claim 2, wherein the controlling circuit is implemented in a programmable logic device (PLD).

5. The circuit arrangement of claim 1, wherein the storage element is a RAM.

6. The circuit arrangement of claim 1, wherein the communications protocol is a TCP/IP stack.

7. The circuit arrangement of claim 6, wherein the physical interface circuit includes an Ethernet transceiver.

8. The circuit arrangement of claim 6, wherein the physical interface circuit includes a wireless transceiver.

9. The circuit arrangement of claim 1, wherein the configuration control circuit is further configured to set up the FPGA for partial configuration and to load a partial configuration bitstream from the storage element to the FPGA responsive to a partial-reconfigure signal from the FPGA.

10. The circuit arrangement of claim 1, wherein the configuration control circuit is further configured and arranged to read back configuration data from the FPGA to the storage element responsive to a read-back signal from the FPGA.

11. The circuit arrangement of claim 1, wherein:

the storage element is implemented in the FPGA by the initial configuration bitstream, and the second configuration bitstream is a partial reconfiguration bitstream, and the storage element is not reconfigurable by the partial reconfiguration bitstream.

12. An FPGA-based communications access point, comprising:

a physical interface circuit arranged for connection to a communications channel;

a memory device comprising an initial configuration bitstream for implementing a communications protocol on an FPGA and further implementing one or more application-specific functions to be performed by the FPGA over the communications channel;

an FPGA coupled to the memory device and to the physical interface circuit, the FPGA having a configuration interface; and a controlling circuit coupled to the memory device and to the configuration interface of the FPGA, the controlling circuit being configured to load the initial configuration bitstream from the memory device into the FPGA upon occurrence of a predetermined event.

13. The communications access point of claim 12, wherein the memory device is a PROM.

14. The communications access point of claim 12, wherein the controlling circuit is implemented in a programmable logic device (PLD).

15. The communications access point of claim 12, wherein the communications protocol is a TCP/IP stack.

16. The communications access point of claim 15, wherein the physical interface circuit includes an Ethernet transceiver.

17. The communications access point of claim 15, wherein the physical interface circuit includes a wireless transceiver.

18. A circuit arrangement for reconfiguration of an FPGA via a communications channel, comprising:

a physical interface circuit arranged for connection to a communications channel;

a storage element;

a memory device configured with an initial configuration bitstream for implementing a communications protocol on the FPGA and further for implementing a control function that writes configuration bits received by the FPGA from the physical interface circuit to the storage element and generates a reconfiguration signal responsive to a first predetermined condition;

an FPGA coupled to the storage element, the memory device, and the physical interface circuit, the FPGA having a configuration interface; and a controlling circuit coupled to the storage element, the memory device, and the configuration interface of the FPGA, the controlling circuit being configured to load the initial configuration bitstream from the memory device into the FPGA responsive to a second predetermined condition, and to load a second configuration bitstream from the storage element into the FPGA responsive to the reconfiguration signal from the FPGA.

19. The circuit arrangement of claim 18, wherein the memory device is a PROM.

20. The circuit arrangement of claim 18, wherein the controlling circuit is implemented in a programmable logic device (PLD).

21. The circuit arrangement of claim 18, wherein the storage element is a RAM.

22. The circuit arrangement of claim 18, wherein the controlling circuit is further configured to load the initial configuration bitstream from the memory device to the FPGA responsive to a cold-configure signal from the FPGA.

23. The circuit arrangement of claim 18, wherein the controlling circuit is further configured to load a third configuration bitstream from the memory device to the FPGA.

24. The circuit arrangement of claim 18, wherein the controlling circuit is further configured to set up the FPGA for partial configuration and to load a partial configuration bitstream from the storage element to the FPGA.

25. The circuit arrangement of claim 24, wherein a partial configuration of the FPGA is initiated responsive to a partial-reconfigure signal from the FPGA.

26. The circuit arrangement of claim 18, wherein the controlling circuit is further configured and arranged to transfer the initial configuration bitstream from the memory device to the storage element.

27. The circuit arrangement of claim 26, wherein the initial configuration bitstream is transferred from the memory device to the storage element responsive to a dump-memory signal from the FPGA.

28. The circuit arrangement of claim 18, wherein the controlling circuit is further configured and arranged to read back configuration data from the FPGA and write the configuration data to the storage element.

29. The circuit arrangement of claim 28, wherein the read back of the configuration data is performed responsive to a read-back signal from the FPGA.

30. The circuit arrangement of claim 18, wherein the wherein the controlling circuit is further configured to:

load an initial configuration bitstream from the memory device to the FPGA responsive to a cold-configure signal from the FPGA;

set up the FPGA for partial configuration and load a partial configuration bitstream from the storage element to the FPGA responsive to a partial-reconfigure signal from the FPGA;

transfer the initial configuration bitstream from the memory device to the storage element responsive to a dump-memory signal from the FPGA; and read back configuration data from the FPGA and write the configuration data to the storage element responsive to a read-back signal from the FPGA.

31. The circuit arrangement of claim 18, wherein:

the storage element is implemented in the FPGA by the initial configuration bitstream, and the second configuration bitstream is a partial reconfiguration bitstream, and the storage element is not reconfigurable by the partial reconfiguration bitstream.

32. A method for reconfiguration of an FPGA via a communications channel, comprising:

configuring the FPGA with an initial configuration bitstream that implements both a communications protocol and a control function;

receiving a second configuration bitstream from the communications channel at the FPGA via the implemented communications protocol;

storing the second configuration bitstream in a storage element under control of the implemented control function; and reconfiguring the FPGA with the second configuration bitstream from the storage element.

33. The method of claim 32, further comprising initiating reconfiguration with the second configuration bitstream in response to a signal from the FPGA.

34. The method of claim 32, wherein:

configuring the FPGA takes place under control of a bootstrapping circuit; and reconfiguring the FPGA takes place under control of a reconfiguration control circuit implemented in the FPGA as a result of configuring the FPGA.

35. The method of claim 32, wherein configuring the FPGA with the initial configuration bitstream comprises loading the initial configuration bitstream from a PROM to the FPGA.

36. The method of claim 32, wherein the storage element is a RAM.

37. The method of claim 32, wherein the FPGA is configured and reconfigured under control of a configuration control circuit.

38. The method of claim 37, wherein the configuration control circuit is implemented with a programmable logic device (PLD).

39. The method of claim 37, further comprising:

providing a configuration instruction signal from the configuration control circuit to the FPGA; and reconfiguring the FPGA in one of a plurality of operating modes specified by the configuration instruction signal, wherein the plurality of operating modes includes:

a first mode of reconfiguring the FPGA with the initial configuration bitstream, a second mode of reconfiguring the FPGA with a full configuration bitstream from the storage element, and a third mode of partially reconfiguring the FPGA with a partial configuration bitstream from the storage element.

40. The method of claim 32, wherein:

the storage element is implemented in the FPGA by the initial configuration bitstream, and reconfiguring the FPGA performs a partial reconfiguration, the storage element not being reconfigured by the partial reconfiguration.

* * * * *